United States Patent
Sze

(10) Patent No.: US 7,371,599 B2
(45) Date of Patent: May 13, 2008

(54) IMAGE SENSOR AND METHOD OF FORMING THE SAME

(75) Inventor: Jhy-Jyi Sze, Tai-Nan (TW)

(73) Assignee: United Microeletronics Corp., No. 3, Li-Hsin Road 2, Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 11/379,053

(22) Filed: Apr. 17, 2006

(65) Prior Publication Data

US 2007/0241375 A1  Oct. 18, 2007

(51) Int. Cl.
*H01L 21/00* (2006.01)

(52) U.S. Cl. .................... 438/48; 438/57; 438/237; 257/E21.438

(58) Field of Classification Search ............ 438/48, 438/57, 237; 257/E21.409, E21.438
See application file for complete search history.

(56) References Cited

U.S. PATENT DOCUMENTS

| | | | | |
|---|---|---|---|---|
| 6,023,081 A * | 2/2000 | Drowley et al. | ............ | 257/292 |
| 6,166,405 A | 12/2000 | Kuriyama et al. | | |
| 7,005,689 B2 * | 2/2006 | Song et al. | ................. | 257/290 |
| 7,057,219 B2 * | 6/2006 | Park et al. | ................... | 257/292 |
| 7,238,562 B2 * | 7/2007 | Jang | ........................... | 438/199 |
| 2005/0274995 A1 * | 12/2005 | Park | ........................... | 257/291 |
| 2006/0121640 A1 * | 6/2006 | Kim | ............................... | 438/57 |

* cited by examiner

*Primary Examiner*—T. N. Quach
(74) *Attorney, Agent, or Firm*—Winston Hsu

(57) ABSTRACT

An image sensor includes a semiconductor substrate, a photo receiving area in the semiconductor substrate, a gate electrode installed in a lateral side of the photo receiving area on the semiconductor substrate, and a patterned dielectric layer covering the gate electrode, the photo receiving area, and exposing a partial gate electrode. A spacer surrounds the gate electrode on the dielectric layer.

14 Claims, 5 Drawing Sheets

IMAGE SENSOR AND METHOD OF FORMING THE SAME

BACKGROUND OF THE INVENTION

1. Field of the Invention

The present invention relates to an image sensor and a method of forming the same.

2. Description of the Prior Art

In recent years, complementary metal-oxide semiconductor (CMOS) image sensors have become popular solid image sensors, largely replacing charge-coupled devices (CCD). Because CMOS image sensors are made by conventional semiconductor manufacturing methods, they have both low cost and small size. Otherwise, CMOS image sensors have high quantum efficiency and low read-out noise, and are thus popularly applied in PC and digital cameras.

The typical CMOS image sensor includes a photo diode for metering the intensity of the light, and three or four metal-oxide semiconductors (MOS) individually having the functions of reset, amplification, and selection.

Please refer to FIG. 1. FIG. 1 schematically illustrates a manufacture of an image sensor according to the prior art. An image sensor 100 is installed on a semiconductor substrate 102, wherein the semiconductor substrate is separated into a non-photo receiving area A, and a photo receiving area B. The photo receiving area B has a photo diode 104 in the semiconductor substrate 102. The non-photo receiving area A has a shallow trench isolation (STI) 103 in the semiconductor substrate 102. Two gate electrodes 106, 108 are installed on the semiconductor substrate 102, wherein the gate electrode 108 is installed between the non-photo receiving area A and the photo receiving area B. In prior image sensor 100 manufacture, the shallow trench isolation 103, the photo diode 104, and the gate electrodes 106, 108 are first formed in the semiconductor substrate 102. Then, a covering layer is made by a chemical vapor deposition (CVD) for covering the gate electrodes 106, 108, and the semiconductor substrate 102. An anisotropic etching process is subsequently performed on the covering layer for forming a spacer 110 around the gate electrodes 106, 108. Next, an ion implantation process is performed to form dopants such as the source/drains 116, 118, 120 in the lateral sides of the gate electrodes 106, 108.

A patterned self-alignment silicide block 112 is formed on the photo receiving area B and a part of the gate electrode 108 near the photo receiving area B. A self-alignment silicide (salicide) process is then performed, so salicides 122, 124, 126, 128 are formed on the gate electrode 106, the gate electrode 108 without the self-alignment silicide block 112, and the source/drain respectively.

Subsequently, an anti-reflection layer (AR) 114 is formed on the semiconductor substrate 102. An inter-layer-dielectrics (ILD) layer is then deposited; a photolithograph process of a contact hole is performed, and an etching process of the contact hole is performed, so as to complete other circuits of the CMOS image sensor. In this prior art, the etching process of the spacer 110 usually has ion-bombardment, charge-up damage, and plasma etching damage to the photo-receiving area B, so the noise of the image sensor increases. Otherwise, the anti-reflection layer 114 is installed on the self-alignment silicide block 112, resulting in the material of the self-alignment silicide block 112 not having the function of anti reflection. This means the effect of the anti-reflection layer 114 will not be good enough.

Please refer to FIG. 2. FIG. 2 schematically illustrates a manufacture of an image sensor according to another prior art. An image sensor 200 is installed on a semiconductor substrate 202, wherein the semiconductor substrate is separated into a non-photo receiving area C, and a photo receiving area D. The photo receiving area D has a photo diode 204 in the semiconductor substrate 202. The non-photo receiving area C has a shallow trench isolation 203 in the semiconductor substrate 202. Two gate electrodes 206, 208 are installed on the semiconductor substrate 202, wherein the gate electrode 208 is installed between the non-photo receiving area C and photo receiving area D. In prior manufacture of the image sensor 200, the shallow trench isolation 203, the photo diode 204, and the gate electrodes 206, 208 are first formed in the semiconductor substrate 202. Then, a covering layer (not shown) is made by a chemical vapor deposition (CVD) for covering the gate electrodes 206, 208, and the semiconductor substrate 202. An etching process is then performed on the covering layer for forming a spacer 210 around the gate electrodes 206, 208, a protecting layer 212 on the photo receiving area D and one side of the gate electrode 208 near the photo receiving area D. Next, an ion implantation process is performed to form dopants such as the source/drains 216, 218, 220 in the lateral sides of the gate electrodes 206, 208.

A patterned self-alignment silicide block 214 is then formed on the protecting layer 212 to cover the photo receiving area D and a part of the gate electrode 208 near the photo receiving area D. A self-alignment silicide process is subsequently performed, so salicides 222, 224, 226, 228 are formed on the gate electrode 206, the gate electrode 208 without the self-alignment silicide block 214, and the source/drain respectively. Finally, an anti-refection layer 216 is formed on the semiconductor substrate 202 for the later contact hole process. FIG. 2 discloses the layout of the protecting layer 212 overlapping the gate electrode 208, so as to avoid plasma damage to the photo receiving area D. The stack made by the protecting layer 212, the self-alignment silicide block 214, and the anti-reflection layer 216 is above the photo receiving area D, however. The thickness of the stack is too thick, however, resulting in it influencing the continuous manufacture and product effect.

Because the prior art has the above-mentioned shortcomings, researching an image sensor and method of manufacturing the same that solves the problems of the prior art is an important issue.

SUMMARY OF THE INVENTION

The present invention provides an image sensor to solve the above-mentioned problems.

An embodiment of the present invention provides an image sensor. It includes a semiconductor substrate, a photo receiving area in the semiconductor substrate, a gate electrode installed in a lateral side of the photo receiving area on the semiconductor substrate, and a patterned dielectric layer covering the gate electrode, the photo receiving area, and exposing a partial gate electrode. A spacer surrounds the gate electrode on the dielectric layer.

Another embodiment of the present invention provides a manufacture of an image sensor. It includes providing a semiconductor substrate, forming a photo receiving area in the semiconductor substrate, forming a gate electrode on one side of the photo receiving area in the semiconductor substrate, forming a dielectric layer on the semiconductor substrate and the dielectric layer covering the gate electrode and the surface of the photo receiving area, forming a spacer around the gate electrode and on the dielectric layer, and performing a source/drain ion implantation process to form a dopant in one side of the gate electrode away from the photo receiving area and on the semiconductor substrate.

The first anti-reflection layer of the present invention is the etching stop layer of the spacer etching process, where the first anti-reflection layer can also protect the photo diode in the photo receiving area from spacer etching damage. Otherwise, the first anti-reflection layer can be the self-alignment silicide block therefore avoiding the contaminants that damage the image sensor. Furthermore, the second anti-reflection layer can be the etching stop layer of the contact hole manufacture. The first and second anti-reflection layers can decrease the reflection of the exposure light in the contact hole photolithograph process.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
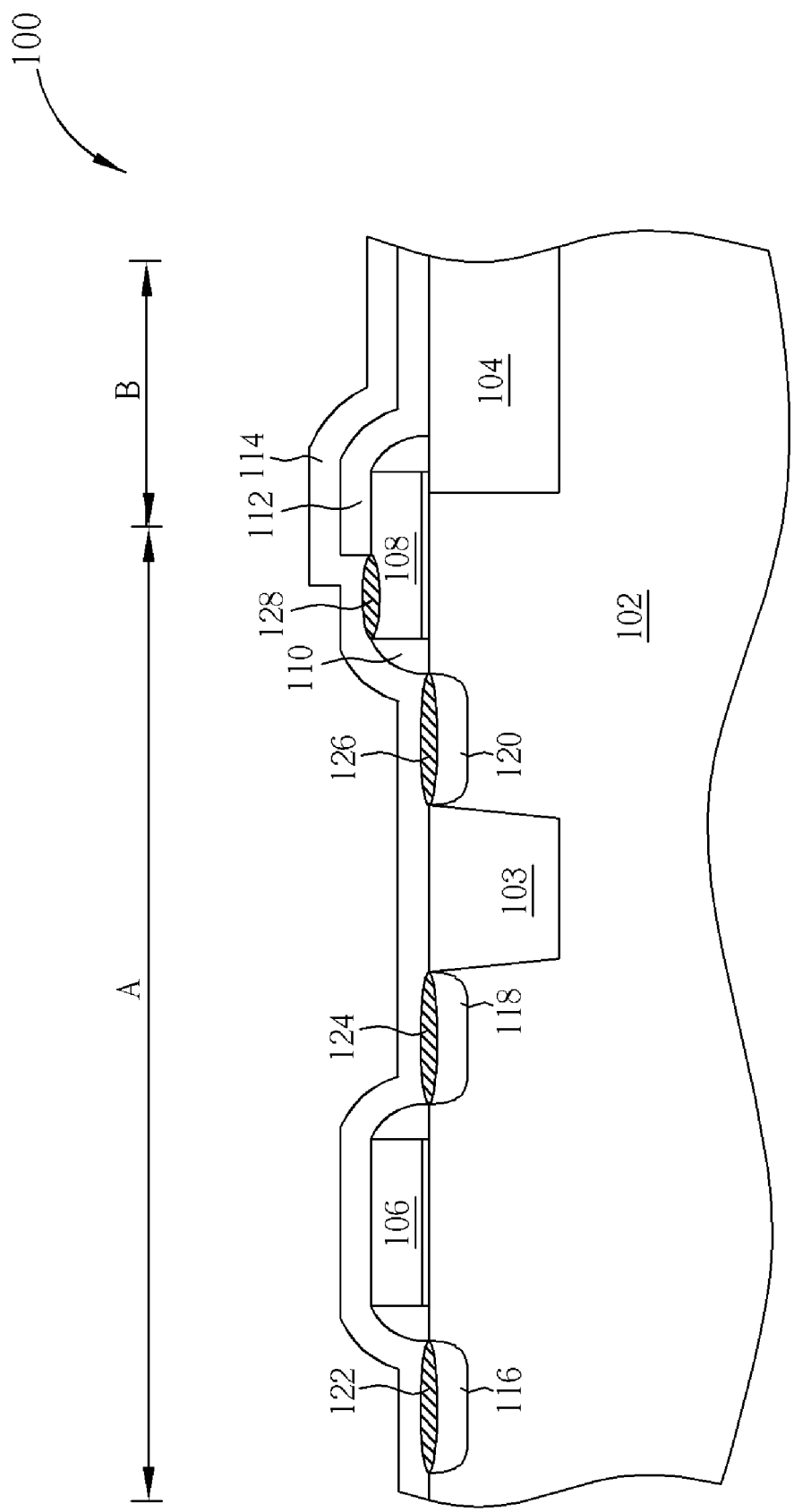
FIG. 1 schematically illustrates a manufacture of an image sensor according to the prior art.
Figure 2:
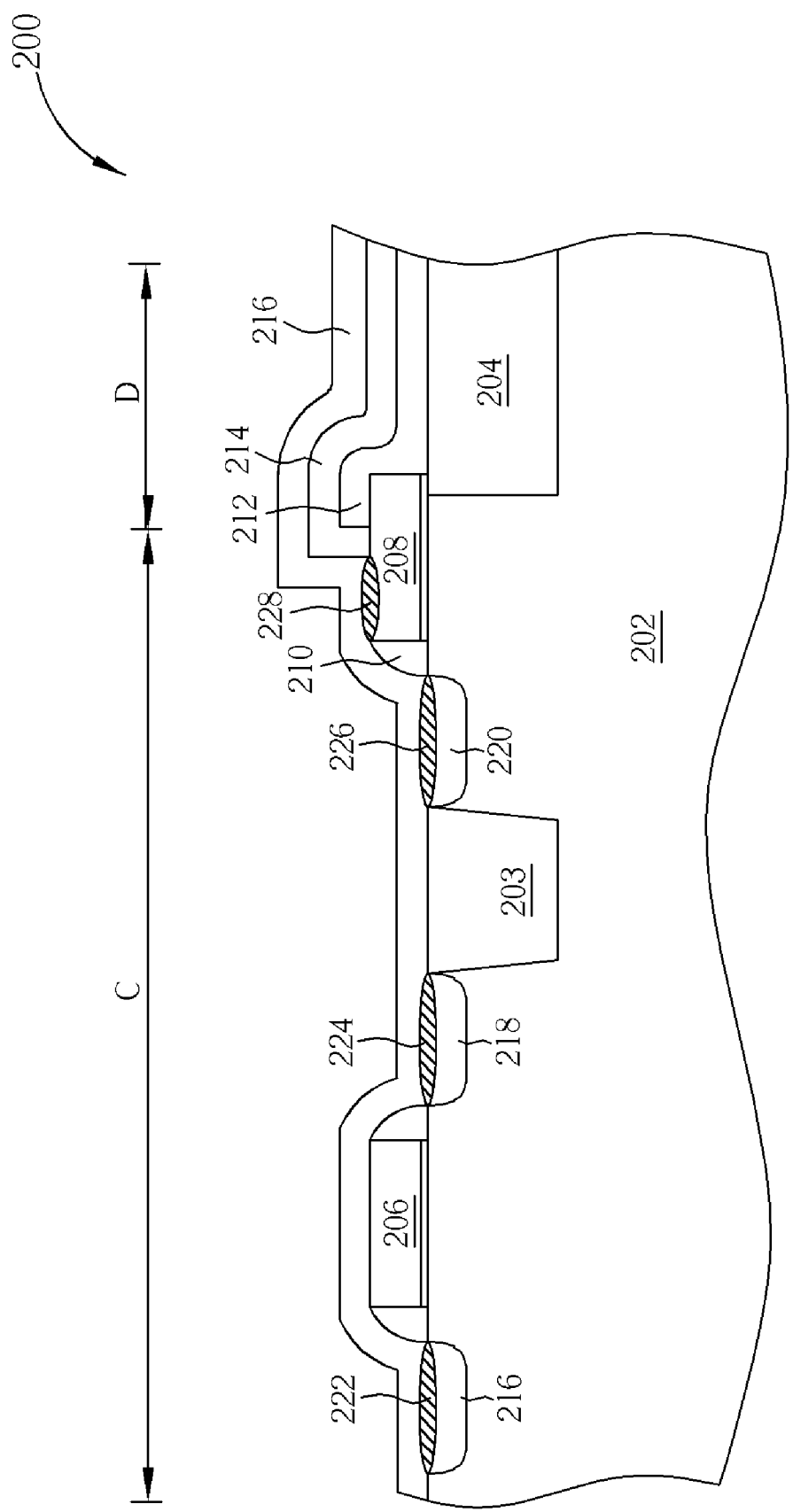
FIG. 2 schematically illustrates a manufacture of an image sensor according to another prior art.
Figure 3:
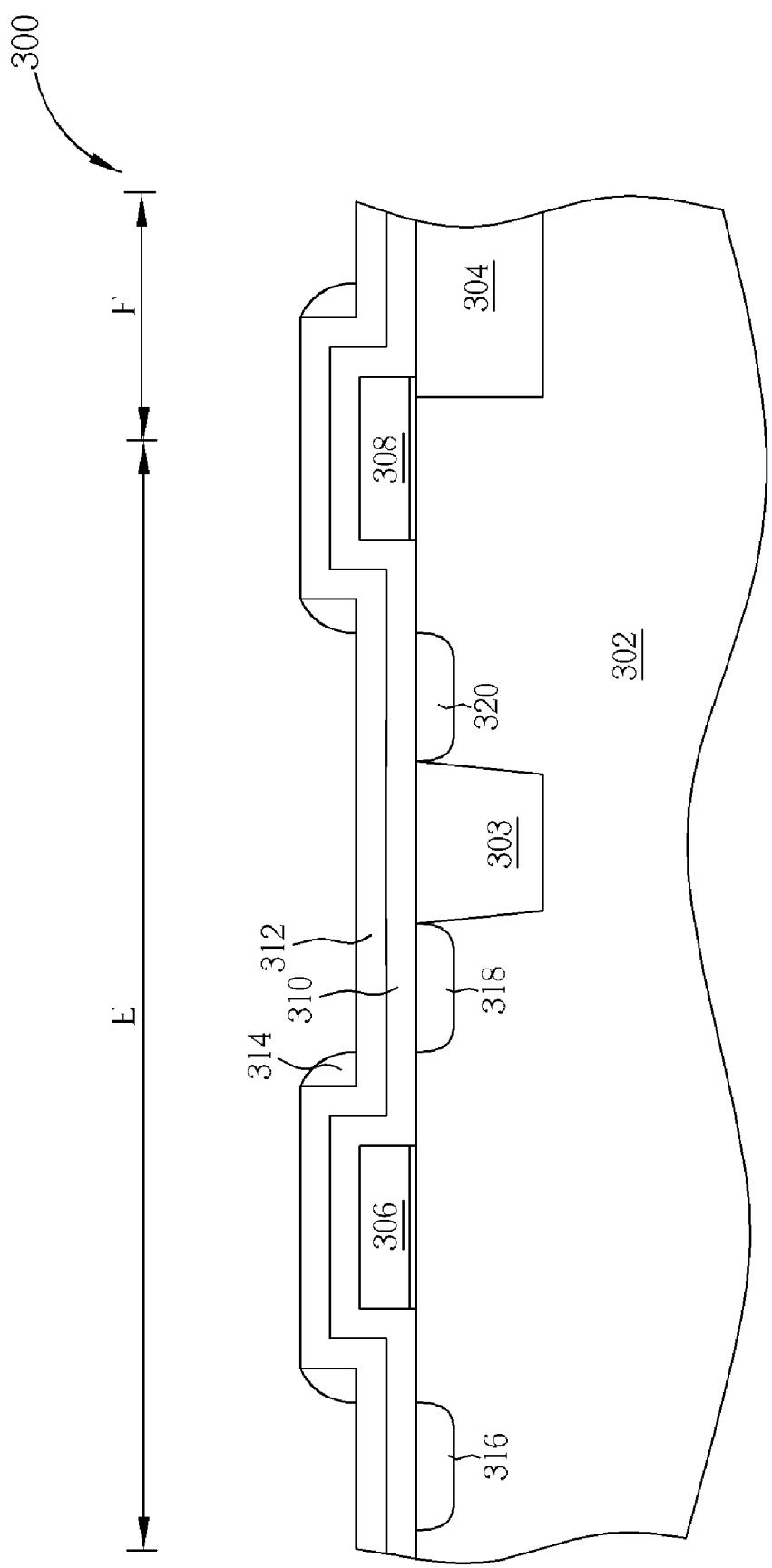
FIGS. 3 to 5 schematically illustrate manufacture of an image sensor according to the present invention.
Figure 4:
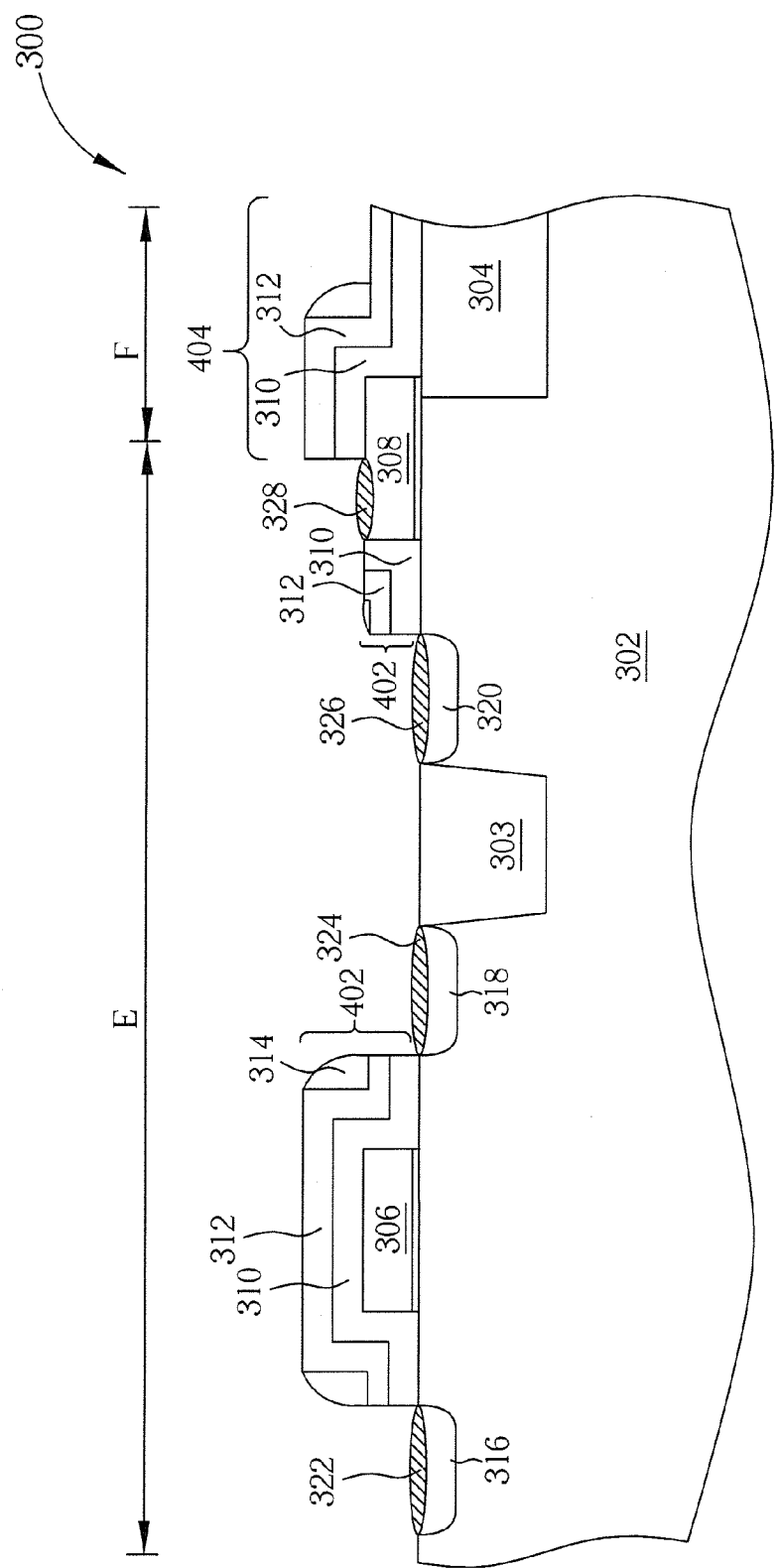
Figure 5:
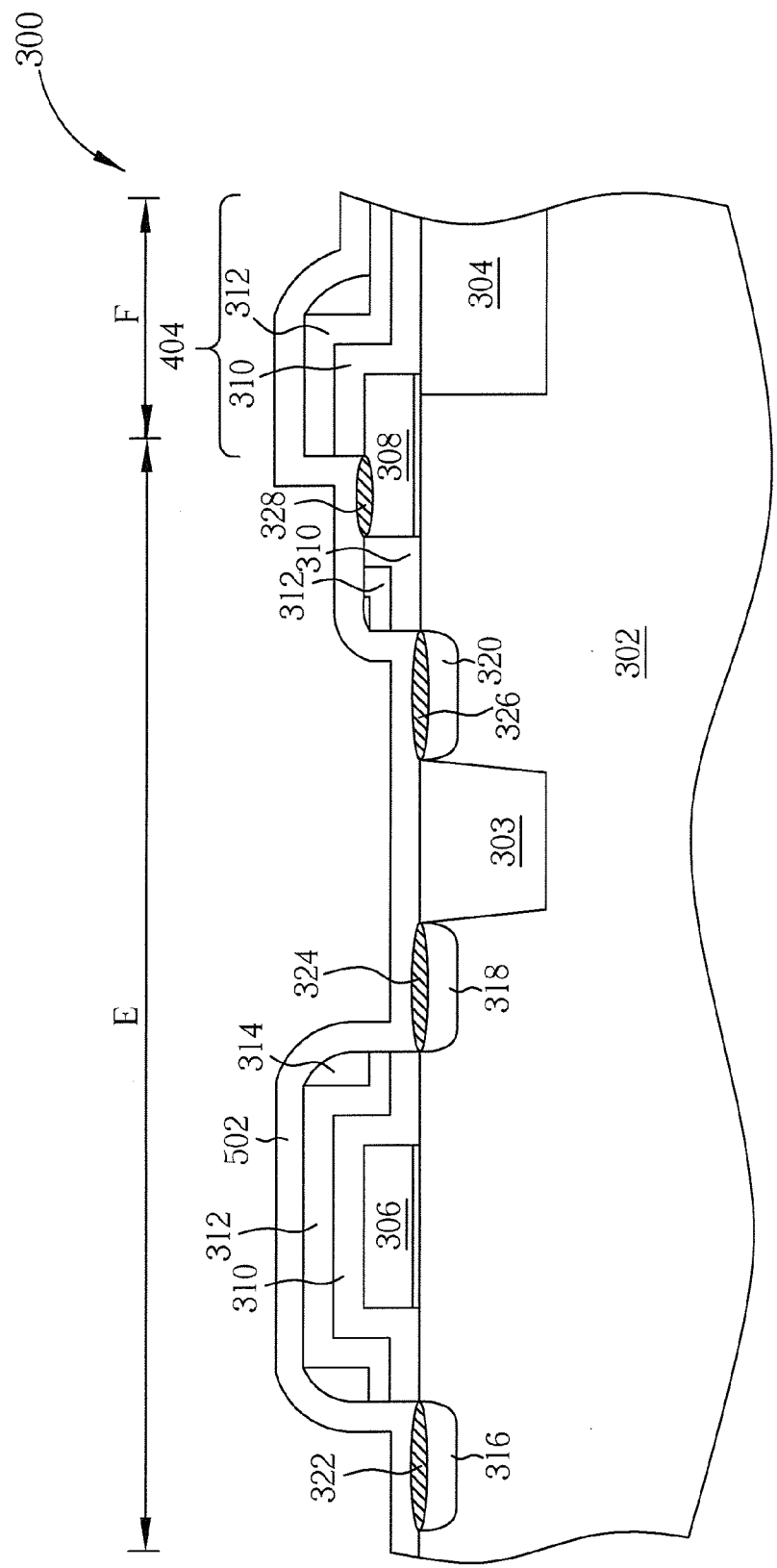

Please refer to FIGS. 3 to 5. FIGS. 3 to 5 schematically illustrate manufacture of an image sensor according to the present invention. In the embodiment, the present invention applies to a CMOS image sensor. An image sensor 300 is installed on a semiconductor substrate 302, wherein the semiconductor substrate 302 is separated into a non-photo receiving area E, and a photo receiving area F. The photo receiving area F has a photo diode 304 in the semiconductor substrate 302. The non-photo receiving area E has a shallow trench isolation 303 in the semiconductor substrate 302, wherein the gate electrode 308 is installed on one side of the photo receiving area F.

The manufacture of the image sensor 300 in the present invention first forms the shallow trench isolation 303, the photo diode 304 and the gate electrodes 306, 308. Next, a chemical vapor deposition process is performed to form a buffer layer 310 covering the semiconductor substrate 302, and the gate electrodes 306, 308. Then, a depositing process is performed to form a dielectric anti-reflection layer 312 on the buffer layer 310. Another depositing process is performed to form a covering layer (not shown) on the anti-reflection layer 312. The part covering layer on the anti-reflection layer 312 is then removed by an isotropic etching process, so as to form the spacer 314 around the gate electrodes 306, 308. The anti-reflection layer 312 is the etching stop layer of the spacer 314 etching process. Otherwise, when the covering layer is etched, the photo receiving area F is covered by the anti-reflection layer 312, so the photo receiving area F will not be damaged under the protection of the anti-reflection layer 312. An ion implantation process is then performed, where dopants such as source/drain 316, 318, 320 are formed in the lateral sides of the gate electrodes 306, 308.

Please refer to FIG. 4. A patterned photo resist layer (not shown) such as a mask of the self-alignment silicide block is formed on the semiconductor substrate 302 by a lithograph process. Next, an etching process is performed, where the mask of the self-alignment silicide block and the spacer 314 are the etching masks, and part of the anti-reflection layer 312 and the buffer layer 310 are etched to form a self-alignment silicide block 404 and the spacer 402. The self-alignment silicide block 404 includes the buffer layer 310 and the anti-reflection layer 312, and part of the self-alignment silicide block 404 is installed on the gate electrode 308 in the non-receiving area E. Furthermore, the spacer 402 around the gate electrodes 306, 308 is made by the buffer layer 310, the anti-reflection layer 312 and the spacer 314.

Next, a self-alignment silicide process is performed to form salicides 322, 324, 326, 328 on the gate electrode 306, the gate electrode 308 without the self-alignment silicide block 404, and the source/drain 316, 318, 320 respectively. The self-alignment silicide process produces a few well-known contaminations such as Sodium ions, which affect the manufacture of the image sensor 300. In the present invention, however, when the self-alignment silicide process is performed, the self-alignment silicide block 404 covers the surface of the photo receiving area F to avoid the contaminations that affect the manufacture of the image sensor 300.

Please refer to FIG. 5. A chemical vapor deposition process is performed, and a dielectric anti-reflection layer 502 is formed on the semiconductor substrate 302. Next, an inter-layer dielectric made by the nitride silicon layer is installed on the semiconductor substrate 302. Then, a continuous contact hole manufacture is performed to complete the circuits of the CMOS image sensor. The anti-reflection layers 312, 502 have anti reflection effects to decrease the exposure light of the contact hole photolithograph process. The anti-reflection layer 502 is the etching stop layer in the contact hole process.

The above-mentioned anti-reflection layers 312, 502 are made by silicon nitride, and can be made by any material having a reflection index that lies between the reflection index of silicon oxide and the reflection index of silicon. The material can be selected from the group consisting of silicon oxy-nitride, cerium oxide, titanium oxide, tantalum oxide, zirconium oxide, and Silicon rich oxide.

In conclusion, the anti-reflection layer 312 of the present invention is the etching stop layer of the spacer 314 etching process, where the anti-reflection layer 312 can also protect the photo diode 304 in the photo receiving area F from the spacer 314 etching damage. Otherwise, the anti-reflection layer 312 can be the self-alignment silicide block 404. The anti-reflection layer 312 can avoid the contaminants that damage the image sensor 300 manufacture in the self-alignment silicide process. Furthermore, the anti-reflection layer 502 can be the etching stop layer of the contact hole manufacture. The reflection index of the anti-reflection layers 312, 502 is between the reflection index of silicon oxide and the reflection index of silicon. So, the anti-reflection layers 312, 502 can decrease the reflection of the exposure light in the contact hole photolithograph process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of an image sensor comprising:
   providing a semiconductor substrate;
   forming a photo receiving area in the semiconductor substrate;
   forming a gate electrode on one side of the photo receiving area in the semiconductor substrate;
   forming a dielectric layer on the semiconductor substrate and the dielectric layer covering the gate electrode and the surface of the photo receiving area, wherein the dielectric layer comprises a first anti-reflection layer and a buffer layer;
   forming a covering layer on the first anti-reflection layer;
   removing a portion of the covering layer to form a spacer around the gate electrode;
   performing a source/drain ion implantation process to form a dopant in one side of the gate electrode away from the photo receiving area and on the semiconductor substrate;
   performing an etching process on the dielectric layer to form a self-alignment silicide block on the gate electrode and the photo receiving area;
   performing a self-alignment silicide process on the gate electrode without the self alignment silicide block, and the dopant to form a plurality of salicides;
   forming a second anti-reflection layer on the gate electrode, the self-alignment silicide block, and the semiconductor substrate;
   forming an inter-layer dielectric on the second anti-reflection layer; and
   performing a contact hole etching process on the inter-layer-dielectric to form a plurality of contact holes.

2. The manufacturing method of claim 1, wherein the second anti-reflection layer is a contact hole etching stop layer.

3. The manufacturing method of claim 2, wherein the reflection indexes of the first and second anti-reflection layers are between the reflection index of silicon oxide and the reflection index of silicon.

4. The manufacturing method of claim 3, wherein the materials of the first and second anti-reflection layers are selected from the group consisting of silicon nitride, silicon oxy-nitride, cerium oxide, titanium oxide, tantalum oxide, zirconium oxide, and silicon rich oxide.

5. The manufacturing method of claim 1, wherein the image sensor is a complementary metal-oxide semiconductor image sensor.

6. The manufacturing method of claim 1, wherein the photo receiving area comprises forming a photo diode.

7. A manufacturing method of an image sensor comprising:
   providing a semiconductor substrate;
   forming a photo receiving area in the semiconductor substrate;
   forming a gate electrode on one side of the photo receiving area in the semiconductor substrate;
   forming a first anti-reflection layer on the semiconductor substrate and the first anti-reflection layer covering the gate electrode and the surface of the photo receiving area;
   forming a spacer around the gate electrode and on the first anti-reflection layer;
   performing a source/drain ion implantation process to form a dopant in one side of the gate electrode away from the photo receiving area and on the semiconductor substrate;
   performing an etching process on the first anti-reflection layer to form a block on the gate electrode and the photo receiving area;
   performing a self-alignment silicide process on the gate electrode without the block, and the surface of the dopant to form a plurality of salicides; and
   forming a second anti-reflection layer on the semiconductor substrate to cover the salicides, the spacer and the surface of the block.

8. The manufacturing method of claim 7, further comprising forming a buffer layer between the first anti-reflection layer and the semiconductor substrate.

9. The manufacturing method of claim 7, wherein the block is a self-alignment silicide block.

10. The manufacturing method of claim 7, further comprising the following steps after forming the second anti-reflection layer:
    forming an inter-layer dielectric on the second anti-reflection layer; and
    performing a contact hole etching process on the inter-layer-dielectric to form a plurality of contact holes.

11. The manufacturing method of claim 10, wherein the reflection indexes of the first and second anti-reflection layers are between the reflection index of silicon oxide and the reflection index of silicon.

12. The manufacturing method of claim 11, wherein the materials of the first and second anti-reflection layers are selected from the group consisting of silicon nitride, silicon oxy-nitride, cerium oxide, titanium oxide, tantalum oxide, zirconium oxide, and silicon rich oxide.

13. The manufacturing method of claim 7, wherein the image sensor is a complementary metal-oxide semiconductor image sensor.

14. The manufacturing method of claim 7, wherein the photo receiving area comprises forming a photo diode.

* * * * *